(12) United States Patent
Tang

(10) Patent No.: US 9,320,176 B2
(45) Date of Patent: Apr. 19, 2016

(54) HEAT DISSIPATION SYSTEM AND RACK-MOUNT SERVER USING THE SAME

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventor: Xian-Xiu Tang, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 275 days.

(21) Appl. No.: 13/910,131

(22) Filed: Jun. 5, 2013

(65) Prior Publication Data

US 2014/0334092 A1  Nov. 13, 2014

(30) Foreign Application Priority Data

May 9, 2013 (CN) .......................... 2013 1 0168332

(51) Int. Cl.
H05K 7/20 (2006.01)

(52) U.S. Cl.
CPC ............................... *H05K 7/20772* (2013.01)

(58) Field of Classification Search
USPC ................................ 361/679.47; 165/104.189
See application file for complete search history.

(56) References Cited

U.S. PATENT DOCUMENTS

| | | | | |
|---|---|---|---|---|
| 4,787,445 A * | 11/1988 | Howcroft | ............... | F01P 11/029 123/41.51 |
| 6,377,453 B1 * | 4/2002 | Belady | ................. | H05K 9/0007 165/185 |
| 6,741,469 B1 * | 5/2004 | Monfarad | ............. | H01L 23/427 165/104.26 |
| 7,028,761 B2 * | 4/2006 | Lee | ........................... | F28F 3/12 165/104.33 |
| 7,120,021 B2 * | 10/2006 | Hamman | ................ | F28D 15/00 165/104.33 |
| 7,318,322 B2 * | 1/2008 | Ota | ..................... | H05K 7/20781 62/259.2 |
| 7,407,000 B2 * | 8/2008 | Lee | .......................... | G06F 1/20 165/104.33 |
| 7,422,053 B2 * | 9/2008 | Siu | ...................... | F28D 15/0233 165/104.26 |
| 7,724,524 B1 * | 5/2010 | Campbell | .......... | H05K 7/20772 165/104.19 |
| 7,770,630 B2 * | 8/2010 | Chesser | ................ | F28D 15/043 165/104.13 |
| 7,770,632 B2 * | 8/2010 | Bhatti | ................. | F28D 15/0233 165/104.14 |
| 7,957,132 B2 * | 6/2011 | Fried | ................... | H05K 7/20809 165/185 |
| 8,118,083 B2 * | 2/2012 | Utsunomiya | ........... | G06F 1/203 165/104.28 |
| 8,913,384 B2 * | 12/2014 | David | .................... | H05K 13/00 361/679.53 |
| 2004/0080912 A1 * | 4/2004 | Goth | ................... | F28D 15/0266 361/699 |
| 2008/0259566 A1 * | 10/2008 | Fried | .................. | H05K 7/20809 361/699 |
| 2011/0226448 A1 * | 9/2011 | Valenzuela | ............... | F28F 3/12 165/109.1 |

* cited by examiner

*Primary Examiner* — Anthony Haughton
*Assistant Examiner* — Matt Dhillon
(74) *Attorney, Agent, or Firm* — Novak Druce Connolly Bove + Quigg LLP

(57) ABSTRACT

A heat dissipation device includes a heat absorbing member, a number of fins mounted on the heat absorbing member, a first connecting pipe, and a second connecting pipe. A top surface of the heat absorbing member defines a serpentine slot. The slot includes an inlet hole and an outlet hole communicating with two opposite ends of the slot and extending through the heat absorbing member. The first connecting pipe is connected to the inlet hole of the heat absorbing member, and the second pipe is connected to the outlet hole of the heat absorbing member.

9 Claims, 5 Drawing Sheets

HEAT DISSIPATION SYSTEM AND RACK-MOUNT SERVER USING THE SAME

BACKGROUND

1. Technical Field

The present disclosure relates to a rack-mount server with a heat dissipation system.

2. Description of Related Art

An ordinary rack-mount server includes a plurality of server units. Each server unit includes a plurality of electronic components, such as central processing units (CPUs). The CPUs generate a large amount of heat during operation. If the heat is not removed rapidly, it will cause damage to the CPUs. Typically, the heat is dissipated out from the server unit by a heat sink and a plurality of system fans. However, dissipation heat by the heat sink and system fans is slow and inefficient.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
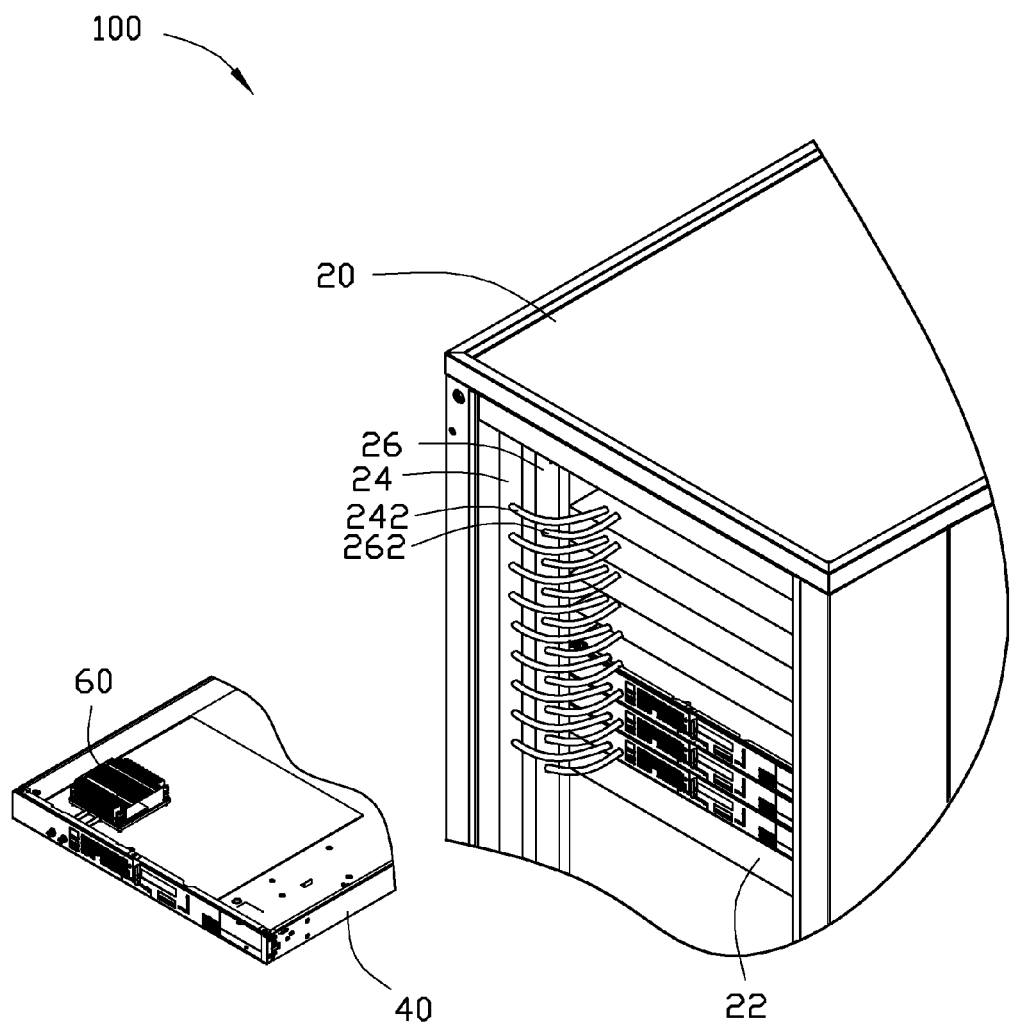
FIG. 1 is a partial, isometric, exploded view of an embodiment of a rack-mount server, wherein the rack-mount server includes a plurality of server units.

FIG. 1 shows an embodiment of a rack-mount server 100. The rack-mount server 100 includes a rack 20, a plurality of server units 40, and a plurality of heat dissipation devices 60 received in the corresponding server units 40. The rack 20 defines a plurality of receiving spaces 22 for receiving the server units 40. The rack 20 includes an inlet pipe 24 and an outlet pipe 26 both located at a rear side of the rack 20 and adjacent to the receiving spaces 22. The inlet pipe 24 includes a plurality of branch pipes 242, and the outlet pipe 26 includes a plurality of branch pipes 262.

Figure 2:
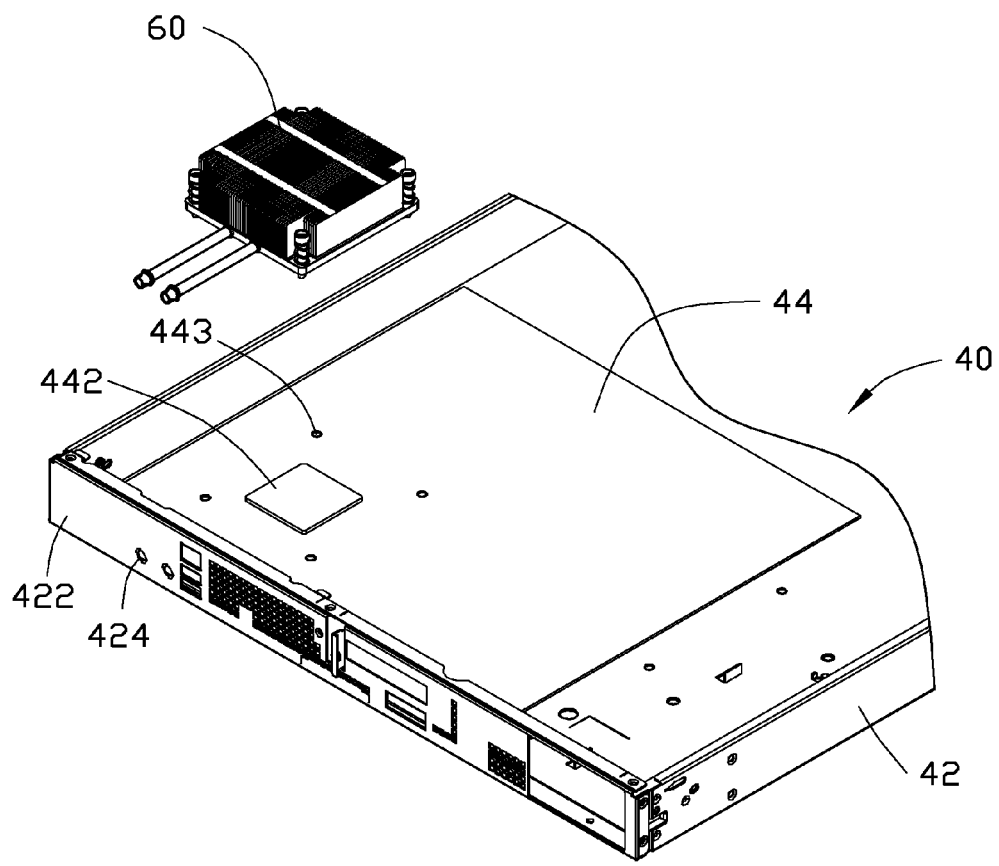
FIG. 2 is an exploded, isometric view of one of the server units of FIG. 1, wherein the server unit includes a heat dissipation device.

FIG. 2 shows each server unit 40 including a chassis 42 and a circuit board 44 mounted in the chassis 42. The chassis 42 includes a rear end plate 422 defining two through holes 424 adjacent to the circuit board 44. An electronic component 442, such as a central processing unit, is mounted on the circuit board 44. The circuit board 44 defines four positioning holes 443 surrounding the electronic component 442.

Figure 3:
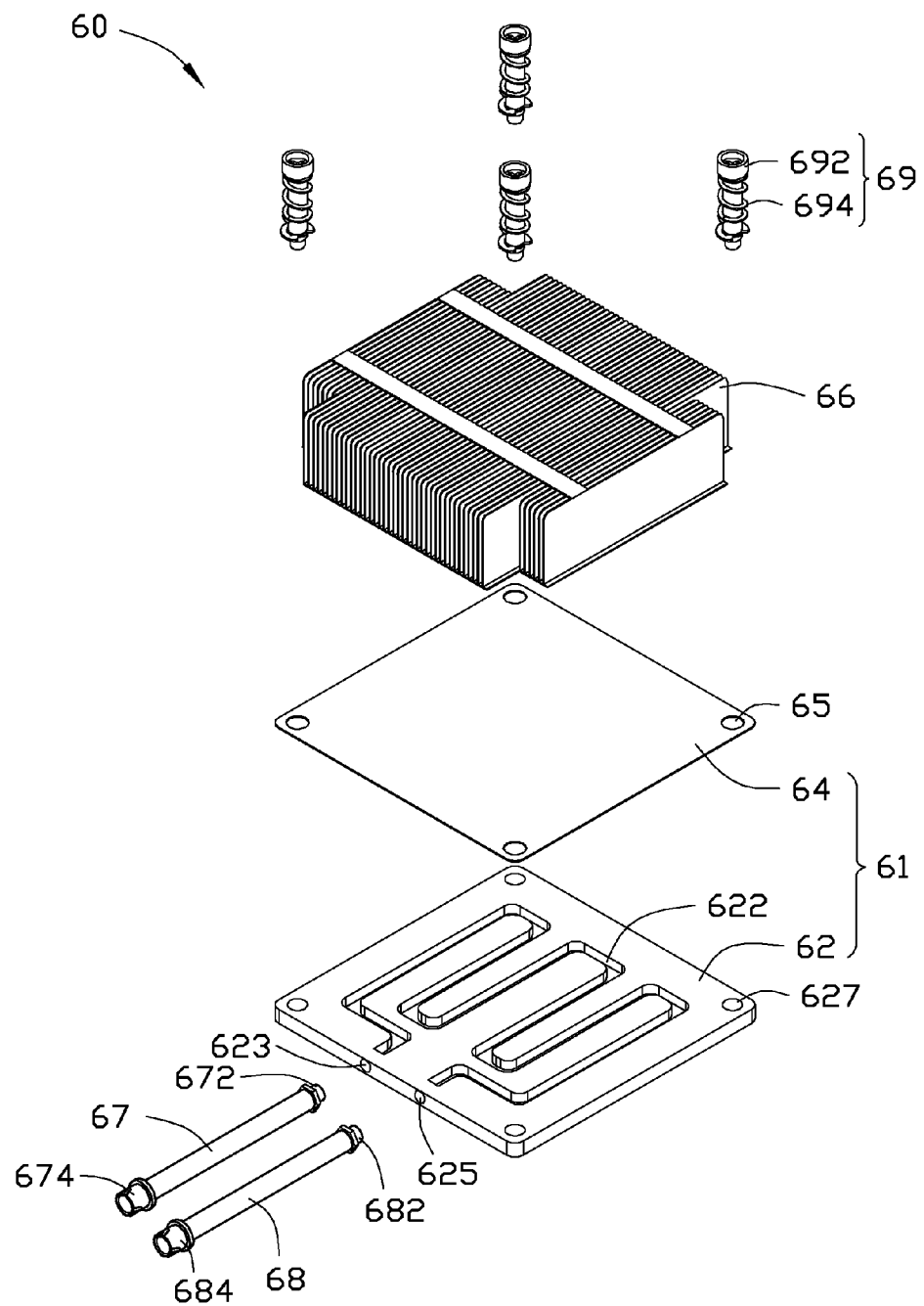
FIG. 3 is an exploded, enlarged, isometric view of heat dissipation device of FIG. 2.

FIG. 3 shows each heat dissipation device 60 including a heat absorbing member 61, a plurality of fins 66, a first connecting pipe 67, a second connecting pipe 68, and four fasteners 69. The heat absorbing member 61 includes a rectangular base 62, and a rectangular cover 64 defining four through holes 645 in four corners. The cover 64 is made of heat-conductive material.

A top surface of the base 62 defines a serpentine slot 622. The slot 622 includes an inlet hole 623 and an outlet hole 625 respectively communicating with two opposite ends of the slot 622. The inlet hole 623 and the outlet hole 625 extend through a side surface of the base 62. Four corners of the base 62 define four installing holes 627. The base 62 is made of heat-conductive material.

The first connecting pipe 67 includes a first connecting head 672 and a second connecting head 674 formed at two opposite ends of the first connecting pipe 67.

The second connecting pipe 68 includes a first connecting head 682 and a second connecting head 684 formed at two opposite ends of the first connecting pipe 68.

Each fastener 69 includes a screw 692 and a resilient member 694 fitting about the screw 692.

In assembly, the cover 64 is hermetically mounted on the top surface of the base 62, with the through holes 645 aligning with the installing holes 627 of the base 62. The fins 66 are mounted on the cover 64 opposite to the base 64 by welding. The first connecting heads 672 and 682 of the first and second connecting pipes 67 and 68 are connected to the inlet hole 623 and the outlet hole 625 of the base 62, respectively. A combination of the heat absorbing member 61, the fins 66, and the first and second connecting pipes 67 and 68 is received in the chassis 42, with a bottom surface of the base 62 opposite to the fins 66 contacting with the electronic component 442. The second connecting heads 674 and 684 of the first and second connecting pipes 67 and 68 are extended through the through holes 424 of the chassis 42, and mounted to the chassis 42. The screws 692 of the fasteners 69 extend through the through holes 645 of the cover 64 and the corresponding installing holes 627 of the base 62, to be screwed into the corresponding positioning holes 443 of the circuit board 44.

Figure 4:
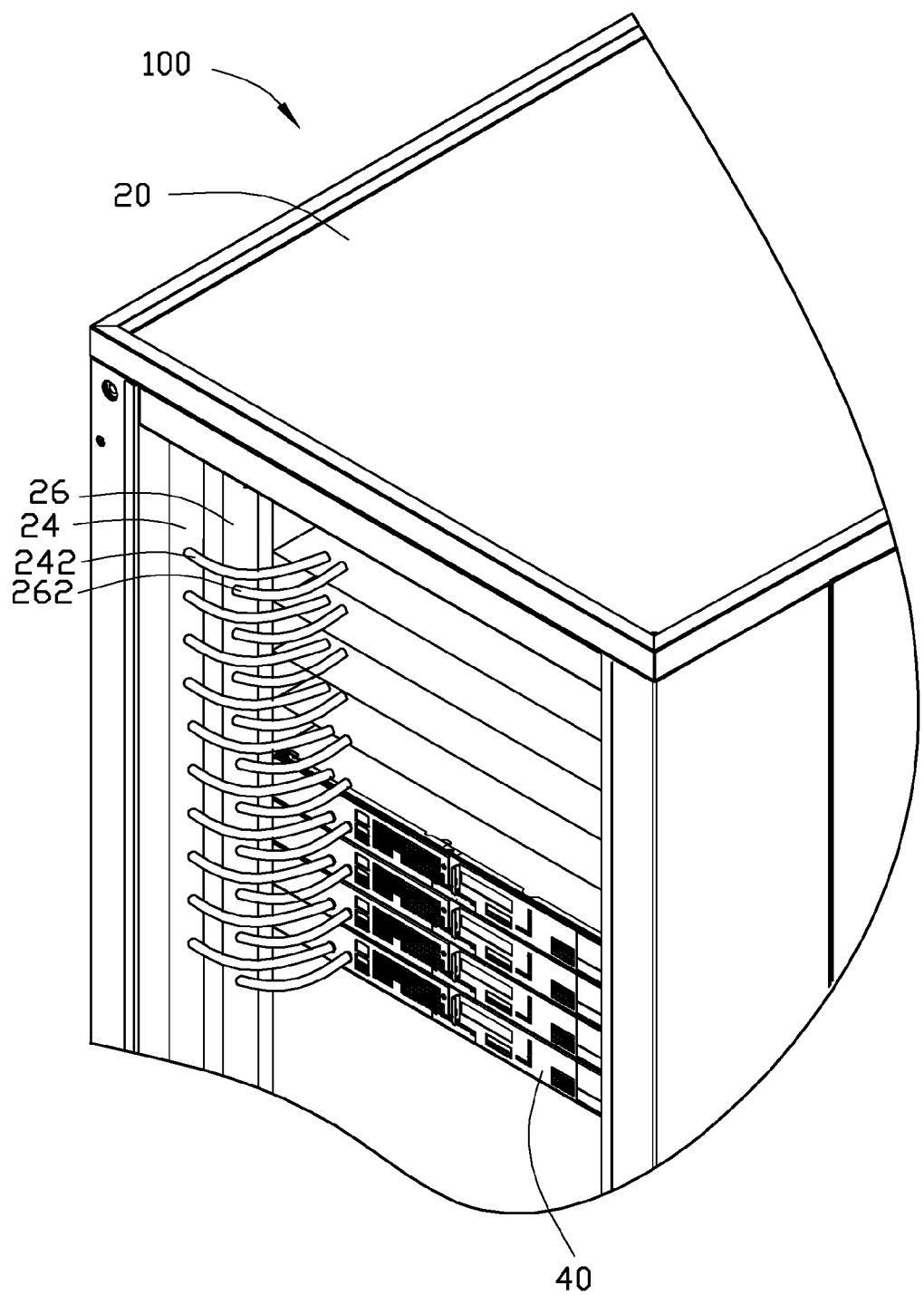
FIG. 4 is an assembled, isometric view of the rack-mount server of FIG. 1.

FIG. 4 shows that in assembly of the server units 40 to the rack 20, each server unit 40 is inserted in the corresponding receiving space 22, with the second connecting heads 674 and 684 adjacent to the inlet pipe 24 and the outlet pipe 26. The branch pipe 242 of the inlet pipe 24 is connected to the corresponding second connecting head 674 of the first connecting pipe 67, and the branch pipe 262 of the outlet pipe 26 is connected to the second connecting head 684 of the corresponding second connecting pipe 68.

Figure 5:
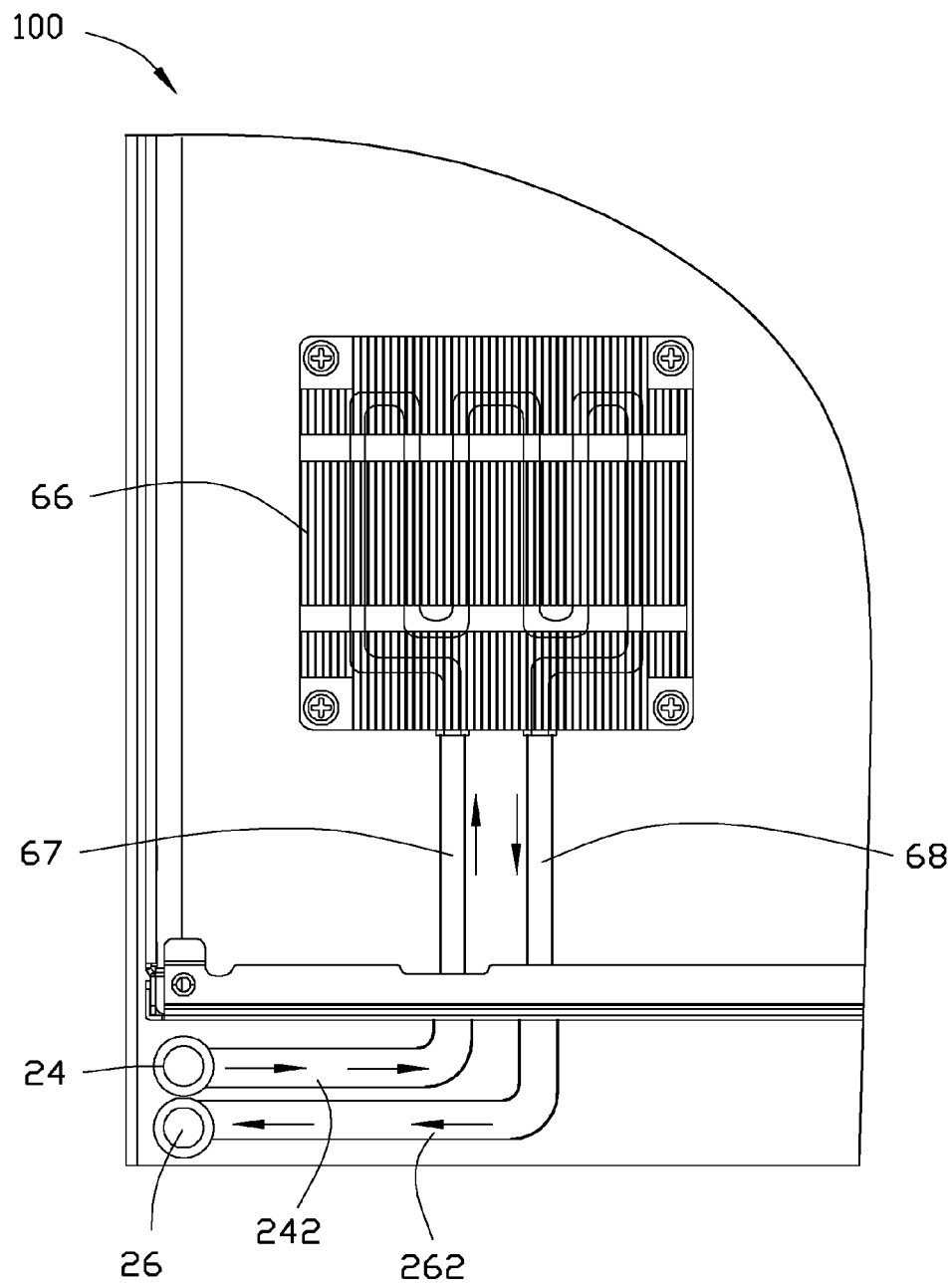
FIG. 5 is a top side plan view of FIG. 4, showing the rack-mount server in use.

FIG. 5 shows that in use, the electronic components 442 operate to generate a lot of heat. Cooled water flows into the slots 622 of the bases 62 from the inlet pipes 24, through the branch pipes 242 and the first connecting pipes 67. A part of the heat of the electronic components 442 is transferred to the fins 66. Another part of the heat of the electronic components 442 is transferred to the cooled water in the slots 622. The heated water of the base 62 flows out of the slots 622 of the bases 62 through the second connecting pipes 68 and the branch pipes 262, and enters the outlet pipe 26. Therefore, the heat dissipation device 60 can continually dissipate heat for the electronic components 442.

In another embodiment, the base 62 and the cover 64 are integrally formed.

It is to be understood, however, that even though numerous characteristics and advantages of the embodiment have been set forth in the foregoing description, together with details of the structure and function of the embodiment, the disclosure is illustrative only, and changes may be made in detail, especially in the matters of shape, size, and arrangement of parts within the principles of the present disclosure to the full extent indicated by the broad general meaning of the terms in which the appended claims are expressed.

What is claimed is:

1. A heat dissipation device, comprising: a heat absorbing member defining a serpentine slot for receiving cooling liquid; the heat absorbing member comprising a base and a cover hermetically mounted on a top surface of the base, the slot defined in the top surface of the base and comprising an inlet hole and an outlet hole communicating with two opposite ends of the slot, the plurality of fins separated from the cover and being mounted on the cover opposite to the base, and the inlet hole and the outlet hole extending through a side surface of the base; a plurality of fins mounted on the heat absorbing member; a first connecting pipe; and a second connecting pipe; wherein, the first connecting pipe is connected to the inlet hole of the heat absorbing member, and the second pipe is connected to the outlet hole of the heat absorbing member; wherein the chassis comprises a rear end plate defining two through holes, the first and second connecting pipes extend through the through holes, to be connected to the inlet pipe and the outlet pipe.

2. The heat dissipation device of claim 1, wherein the heat absorbing member is made of heat-conductive material.

3. The heat dissipation device of claim 1, wherein the first connecting pipe comprises a first connecting head installed in the inlet hole of the heat absorbing member, and a second connecting head opposite to the first connecting head.

4. The heat dissipation device of claim 1, wherein the second connecting pipe comprises a first connecting head installed in the outlet hole of the heat absorbing member, and a second connecting head opposite to the first connecting head.

5. The heat dissipation device of claim 1, wherein the base and the cover are both made of heat-conductive material.

6. A rack-mount server, comprising: a rack; a server unit comprising a chassis received in the rack, a circuit board mounted in the chassis, and an electronic component mounted on the circuit board; a heat dissipation device comprising a heat absorbing member contacting with a top of the electronic component, a plurality of fins mounted on the heat absorbing member, a first connecting pipe, and a second connecting pipe; an inlet pipe; and an outlet pipe; wherein the heat absorbing member comprises a base and a cover hermetically mounted on a top surface of the base, a serpentine slot being defined in the top surface of the base and comprising an inlet hole and an outlet hole communicating with two opposite ends of the slot, the plurality of fins separated from the cover and being mounted on the cover opposite to the base, and the inlet hole and the outlet hole extending through a side surface of the base, the first connecting pipe is connected between the inlet hole of the heat absorbing member and the inlet pipe, and the second connecting pipe is connected between the outlet hole of the heat absorbing member and the outlet pipe; wherein the chassis comprises a rear end plate defining two through holes, the first and second connecting pipes extend through the through holes, to be connected to the inlet pipe and the outlet pipe.

7. The rack-mount server of claim 6, wherein the first connecting pipe comprises a first connecting head connected in the inlet hole of the heat absorbing member, and a second connecting head extending through the corresponding through hole of the chassis to be connected to the inlet pipe.

8. The rack-mount server device of claim 6, wherein the second connecting pipe comprises a first connecting head connected in the outlet hole of the heat absorbing member, and a second connecting head extending through the corresponding through hole of the chassis to be connected to the outlet pipe.

9. The rack-mount server of claim 6, wherein the base and the cover are both made of heat-conductive material.

* * * * *